(12) United States Patent
Ishiduka

(10) Patent No.: US 7,295,438 B2
(45) Date of Patent: Nov. 13, 2007

(54) HEAT RECEIVING SHEET, ELECTRONIC APPARATUS, AND FABRICATION METHOD FOR HEAT RECEIVING SHEET

(75) Inventor: Masanobu Ishiduka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 179 days.

(21) Appl. No.: 11/181,789

(22) Filed: Jul. 15, 2005

(65) Prior Publication Data
US 2006/0215371 A1    Sep. 28, 2006

(30) Foreign Application Priority Data
Mar. 23, 2005    (JP) .............................. 2005-084794

(51) Int. Cl.
*H05K 7/20* (2006.01)
(52) U.S. Cl. .................. 361/704; 361/706; 361/708; 428/200; 428/202; 428/442; 428/457; 524/430; 524/700; 165/80.3; 165/185
(58) Field of Classification Search ........ 361/700–704, 361/707–710, 713, 764; 428/200, 202, 206, 428/208, 447, 451; 252/511–516; 524/424, 524/430, 433, 700, 847; 556/458, 482; 525/477; 528/15, 24, 31, 32; 165/80.3, 185; 257/706–713; 174/16.3, 252
See application file for complete search history.

(56) References Cited
U.S. PATENT DOCUMENTS 5,305,186 A * 4/1994 Appelt et al. ............... 361/704
6,169,142 B1 * 1/2001 Nakano et al. .............. 524/862
6,306,957 B1 * 10/2001 Nakano et al. .............. 524/700
6,379,806 B1 * 4/2002 Takamura et al. ........... 428/447
6,506,331 B2 * 1/2003 Meguriya .................... 264/327

FOREIGN PATENT DOCUMENTS

| JP | 407149365 A | * | 6/1995 |
| JP | 11-26968 A | | 1/1999 |
| JP | 02000077872 A | * | 3/2000 |
| JP | 2001-270021 A | | 10/2001 |

* cited by examiner

*Primary Examiner*—Michael Datskovskiy
(74) *Attorney, Agent, or Firm*—Arent Fox, LLP

(57) ABSTRACT

A heat receiving sheet for receiving heat from electronic components comprises a heat transfer part and a heat insulation part. A heat-generating component which is an electronic component having a high heat generation rate contacts with the heat transfer part of the heat receiving sheet, while a low-temperature component which is an electronic component having a low heat generation rate and having thermal weakness contacts with the heat insulation part of the heat receiving sheet. The heat generated in the heat-generating component is transmitted to the heat receiving sheet (heat transfer part) in a contacted state, so that the heat-generating component is cooled. The low-temperature component contacts with the heat insulation part, hence does not receive via the heat receiving sheet the heat generated in the heat-generating component.

8 Claims, 9 Drawing Sheets

INTRODUCTION/
SOLIDIFICATION

FIG. 8

| | TEMPERATURE OF HEAT-GENERATING COMPONENT (°C) | TEMPERATURE OF LOW-TEMPERATURE COMPONENT (°C) | PRESENCE/ABSENCE OF POSITION SLIPPAGE OF SHEET |
|---|---|---|---|
| PRESENT INVENTION CASE | 45 | 32 | ABSENCE |
| CONTROL CASE | 92 | 25 | ABSENCE |
| PRIOR ART CASE | 50 | 40 | ABSENCE |
| COMPARISON CASE | 52 | 28 | PRESENCE |

HEAT RECEIVING SHEET, ELECTRONIC APPARATUS, AND FABRICATION METHOD FOR HEAT RECEIVING SHEET

CROSS-REFERENCE TO RELATED APPLICATIONS

This Nonprovisional application claims priority under 35 U.S.C. §119(a) on Patent Application No. 2005-84794 filed in Japan on Mar. 23, 2005, the entire contents of which are hereby incorporated by reference.

BACKGROUND OF THE INVENTION

The present invention relates to a heat receiving sheet for receiving heat from heat generating bodies such as electronic components, an electronic apparatus provided with a heat receiving sheet, and a method of fabricating a heat receiving sheet.

In an electronic apparatus such as a desktop computer, a notebook computer, and a mobile communication apparatus, electronic components such as a CPU element, coil elements, and capacitors are mounted on a printed circuit board. In recent years, with progresses in the processing speed, the functionality, and the performance of electronic apparatuses, the heat generation during the operation of these electronic components tends to increase. Thus, in order that stable operation should be achieved in the electronic apparatuses, the heat generated by the electronic components need be released rapidly to the outside. That is, heat releasing performance need be improved.

In the case that a sufficient space is available over the electronic components, techniques of directly cooling the electronic components are adopted. These techniques include: an air cooling method using a heat sink and a cooling fan; and a liquid cooling method using a passage through which a coolant is circulated. In contrast, in the case that a space for such cooling members is not available over the electronic components, a metal or carbon heat transfer plate or alternatively a heat pipe is provided so that the heat is transported from the electronic components to a location where a heat sink or a cooling fan is installed.

However, when a plurality of electronic components having diverse heights are mounted on the same substrate, fabrication and installation are difficult for such a heat transfer plate or a heat pipe. However, in such a case, a method is known that the entire substrate is covered with a several-mm-thick heat receiving sheet composed of silicone rubber having a relatively high thermal conductivity, so that the heat from the electronic components is diffused (see, for example, Japanese Patent Application Laid-Open No. 11-26968 (1999)).

This method employing a heat receiving sheet composed of silicone rubber has an advantage that a larger number of electronic components can be cooled using a small space in comparison with the method of employing a metal heat sink on an electronic component that generates heat. Nevertheless, the following problems arise at the same time. When the heat receiving sheet is heated, and when its temperature goes high, a thermally weak electronic component can conversely receive the heat from the heat receiving sheet, so that the property of the electronic component can degrade. Further, the electronic components mounted on the printed circuit board have diverse heights depending on the kind of the component. Thus, a high pressure acts on a large-height electronic component, and thereby causes damage to the bonding portion between the electronic component and the printed circuit board. In order to avoid the damage caused by the high pressure, a heat receiving sheet having flexibility is useful. Nevertheless, when the orientation of the electronic apparatus is changed, the flexibility can cause position slippage or removal of the heat receiving sheet. On the other hand, in a small-height electronic component, the pressure is insufficient, and so is the contact with the heat receiving sheet. This causes the problem of a low cooling efficiency.

BRIEF SUMMARY OF THE INVENTION

The invention has been devised in view of this situation. An object of the invention is to provide: a heat receiving sheet in which a heat transfer part and a heat insulation part are provided so that the problems described above are resolved, in particular, a thermally weak electronic component is protected; an electronic apparatus provided with a heat receiving sheet; and a fabrication method for a heat receiving sheet used in fabricating this heat receiving sheet.

A heat receiving sheet according to the invention is a heat receiving sheet for receiving heat generated in a plurality of heat generating bodies, wherein a heat transfer part and a heat insulation part are provided. In the heat receiving sheet of the invention, a heat generating body having a high heat generation rate contacts with the heat transfer part, while a heat generating body having a low heat generation rate and having thermal weakness contacts with the heat insulation part. Thus, the heat from the heat generating body at a high temperature is transported at a high rate via the heat transfer part. On the other hand, the heat generating body having thermal weakness contacts with the heat insulation part, and hence does not receive heat from the heat receiving sheet. This avoids adverse influence from the heat.

An electronic apparatus according to the invention is an electronic apparatus provided with a heat receiving sheet for receiving heat generated in a plurality of electronic components, wherein the heat receiving sheet comprises a heat transfer part and a heat insulation part, while the heat receiving sheet is arranged such that among a plurality of the electronic components, a first electronic component having a high heat generation rate should contact with the heat transfer part, and that a second electronic component having a lower heat generation rate than the first electronic component should contact with the heat insulation part. Thus, in the electronic apparatus of the invention, the first electronic component having a high heat generation rate contacts with the heat transfer part of the heat receiving sheet, while the second electronic component having a low heat generation rate and having thermal weakness contacts with the heat insulation part of the heat receiving sheet. Accordingly, the heat from the first electronic component at a high temperature is transported at a high rate via the heat transfer part. On the other hand, the second electronic component having thermal weakness contacts with the heat insulation part, and hence does not receive heat from the heat receiving sheet. This avoids adverse influence such as property degradation caused by the heat.

A fabrication method for a heat receiving sheet according to the invention is a method of fabricating a heat receiving sheet provided with a heat transfer part and a heat insulation part, comprising: combining one or a plurality of heat transfer bodies with one or a plurality of heat insulation bodies, and thereby fabricating a combined body; and using the fabricated combined body. In a fabrication method for a heat receiving sheet according to the invention, a heat transfer body and a heat insulation body are combined so that a combined body is fabricated. Then, the fabricated combined body is, for example, sliced, so that a heat receiving sheet comprising a heat transfer part and a heat insulation part is fabricated. This permits easy fabrication of a heat receiving sheet comprising a heat transfer part and a heat insulation part.

A fabrication method for a heat receiving sheet according to the invention is a method of fabricating a heat receiving sheet provided with a heat transfer part and a heat insulation part, comprising: fabricating a hole in a sheet-shaped heat transfer body or a sheet-shaped heat insulation body; and inserting a sheet-shaped heat insulation body or a sheet-shaped heat transfer body into the fabricated hole. Thus, in the fabrication method for a heat receiving sheet according to the invention, a hole is fabricated in a sheet-shaped heat transfer body or a sheet-shaped heat insulation body. Then, a sheet-shaped heat insulation body or a sheet-shaped heat transfer body is inserted into the fabricated hole, so that a heat receiving sheet comprising a heat transfer part and a heat insulation part is fabricated. This permits easy fabrication of a heat receiving sheet comprising a heat transfer part and a heat insulation part.

A fabrication method for a heat receiving sheet according to the invention is a method of fabricating a heat receiving sheet provided with a heat transfer part and a heat insulation part, comprising: fabricating a mold cavity for a heat receiving sheet; placing in the fabricated mold cavity a sheet-shaped heat transfer body or a sheet-shaped heat insulation body provided with one or a plurality of holes; and forming in the hole a sheet-shaped heat insulation body or a sheet-shaped heat transfer body. In the fabrication method for a heat receiving sheet according to the invention, a mold cavity for a heat receiving sheet is fabricated. Then, a sheet-shaped heat transfer body or a sheet-shaped heat insulation body provided with a hole is placed in the fabricated mold cavity. Then, a sheet-shaped heat insulation body or a sheet-shaped heat transfer body is formed in the hole, so that a heat receiving sheet comprising a heat transfer part and a heat insulation part is fabricated. This permits easy fabrication of a heat receiving sheet comprising a heat transfer part and a heat insulation part.

The above and further objects and features of the invention will more fully be apparent from the following detailed description with accompanying drawings.

BRIEF DESCRIPTION OF THE SEVERAL VIEWS OF THE DRAWINGS

FIG. 8 is a diagram showing the measured values of temperature in electronic components employing various kinds of heat receiving sheets.

DETAILED DESCRIPTION OF THE INVENTION

The invention is described below in detail with reference to the drawings showing the embodiments. It should be noted that the invention is not limited to the following embodiments.

Figure 1:
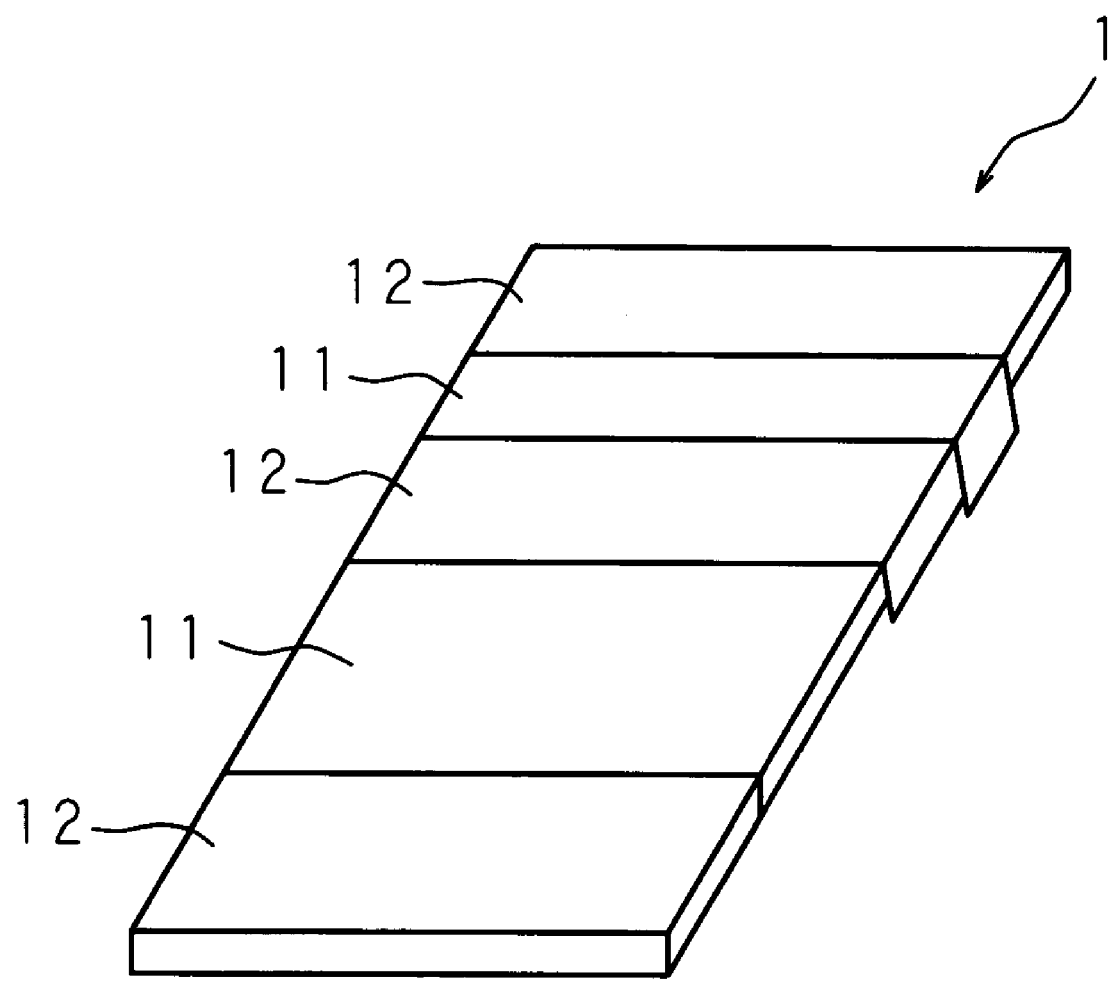
FIG. 1 is a perspective view showing a heat receiving sheet according to the invention.
Figure 2A:
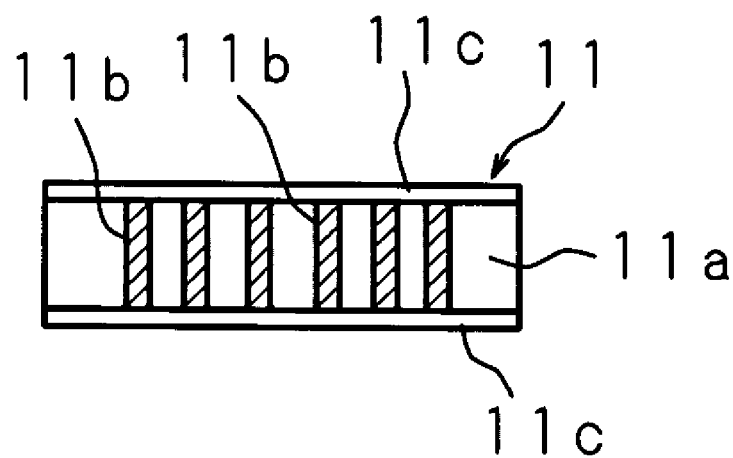
FIGS. 2A and 2B are sectional views showing the structure of a heat transfer part and a heat insulation part of a heat receiving sheet.
Figure 2B:
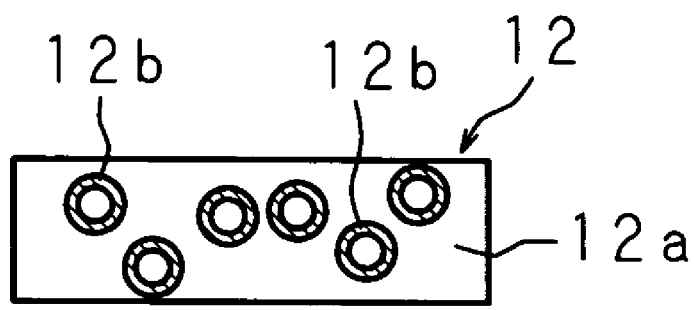

FIG. 1 is a perspective view showing a heat receiving sheet according to the invention. A heat receiving sheet 1 comprises: heat transfer parts 11 having a heat transferring property; and heat insulation parts 12 having heat insulation property. FIG. 2A is a sectional view showing the structure of the heat transfer part 11. FIG. 2B is a sectional view showing the structure of the heat insulation part 12.

In the heat transfer part 11, a plurality of metal wires 11b composed of copper wires or the like are vertically mounted within a substrate 11a composed of silicone rubber or the like, while each of the upper and the lower surfaces is covered with a thin electric insulation sheet 11c. Since the metal wires 11b are oriented in the direction of heat transfer, a high heat releasing efficiency is obtained in the heat transfer part 11.

In the heat insulation part 12, glass balloons 12b which are hollow glass bodies are distributed as fillers in a substrate 12a composed of silicone rubber or the like. In place of the glass balloons 12b used in this example, hollow fibrous bodies (fibrous balloons), hollow resin bodies (resin balloons), porous ceramics, or the like may be distributed as fillers in the substrate 12a, so that the heat insulation part 12 may be constructed.

Figure 3:
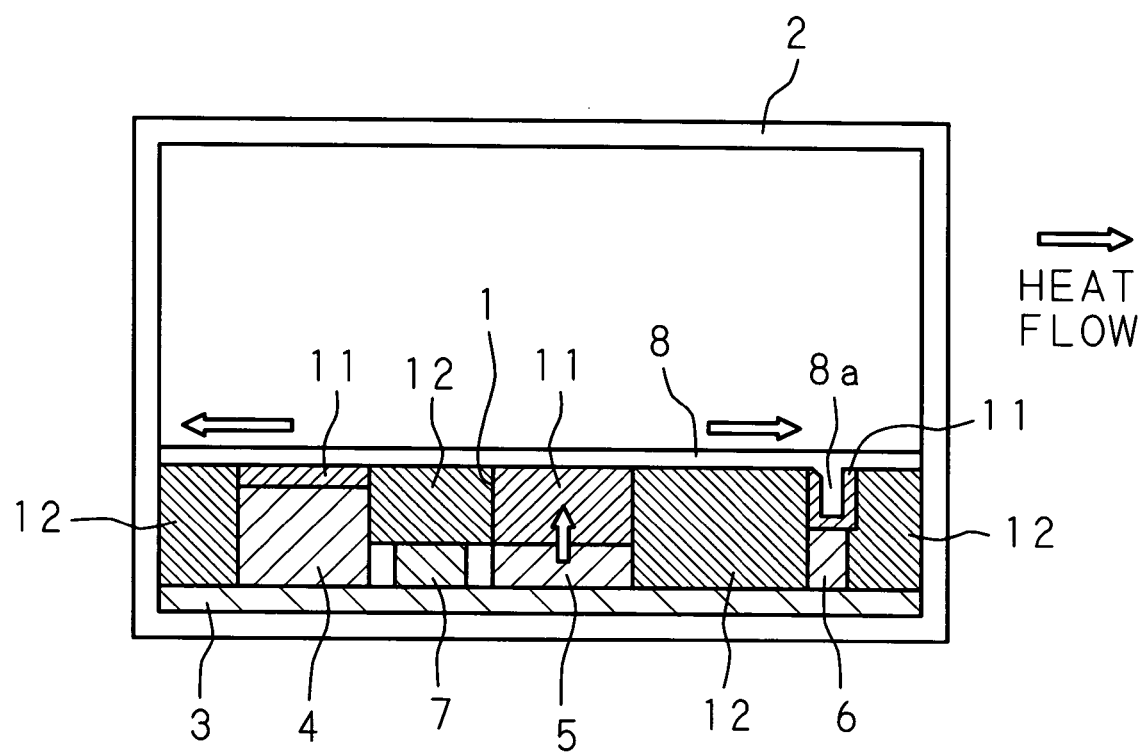
FIG. 3 is a sectional view showing the structure of an electronic apparatus according to the invention.

FIG. 3 is a sectional view showing the structure of an electronic apparatus according to the invention, where a heat receiving sheet 1 is employed that comprises a heat transfer part 11 and a heat insulation part 12 as shown in FIG. 1. The electronic apparatus is provided with a metal housing 2. A printed circuit board 3 is provided in the lower part of the housing 2. A plurality of electronic components 4, 5, 6, and 7 serving as heat generating bodies are mounted on the printed circuit board 3. The electronic components 4, 5, and 6 have a high heat generation rate (referred to as heat-generating components 4, 5, and 6, in some cases hereafter). The electronic components 7 has a low heat generation rate and has thermal weakness (referred to as a low-temperature component 7, in some cases hereafter).

A core member 8 composed of aluminum or the like is bridged between the right and left parts of the housing 2. The heat receiving sheet 1 is provided in close contact with the lower side of the core member 8. The heat-generating components 4, 5, and 6 contact with the heat transfer parts 11 of the heat receiving sheet 1. The low-temperature component 7 contacts with the heat insulation part 12 of the heat receiving sheet 1. The heat receiving sheet 1 has high flexibility, and hence realizes close contact with the electronic components. The thicknesses of the heat transfer part 11 and the heat insulation part 12 are set up in accordance with the heights of corresponding electronic components. The heat transfer parts 11 containing the metal wires 11b contact with the electronic components. However, the electric insulation sheet 11c is formed on the surface of each heat transfer part 11, and hence maintains electric insulation between the heat transfer part 11 and the electronic component.

A bending part 8a fabricated by bending the core member 8 enters the inside of the heat transfer part 11 in contact with the heat-generating component 6 having a small area. This bending part 8a is provided in order to prevent position slippage of the heat receiving sheet 1. In each area where no electronic component is provided, a heat insulation part 12 is located in a manner contacting with the printed circuit board 3.

The heat generated in the heat-generating components 4, 5, and 6 is transmitted to the heat receiving sheet 1 (heat transfer part 11) in a contacted state. Then, the heat flow is directed to the core member 8 and the housing 2, so that the heat-generating components 4, 5, and 6 are cooled. At that time, the substrate 11a of the heat receiving sheet 1 (heat transfer part 11) is composed of silicone rubber having high flexibility. This achieves close and large-area contact of the heat-generating components 4, 5, and 6 with the heat receiving sheet 1 (heat transfer part 11), and hence realizes a high heat releasing property.

The low-temperature component 7 contacts with the heat insulation part 12 of the heat receiving sheet 1, hence seldom receives via the heat receiving sheet 1 the heat generated in the heat-generating components 4, 5, and 6, and further is protected from the surrounding radiant heat. Thus, the low-temperature component 7 is free from influence of the heat, as well as from thermal damage.

Alternatively, another technique could also be possible that a heat receiving sheet covers solely the electronic components (heat-generating components) having a high heat generation rate, and that the heat receiving sheet does not cover the electronic component (low-temperature component) having a low heat generation rate and having thermal weakness. Nevertheless, in this technique, a gap occurs between the core member and the low-temperature component. Thus, when the electronic apparatus is inclined or the like, a problem such as position slippage and deformation of the heat receiving sheet can arise. In contrast, in the invention, all electronic components are covered by the single heat receiving sheet 1. Thus, the above-mentioned problem is avoided even when the electronic apparatus is inclined.

Next, described below are three methods of fabricating a heat receiving sheet provided with a heat transfer part and a heat insulation part according to the invention.

First Embodiment

Figure 4A:
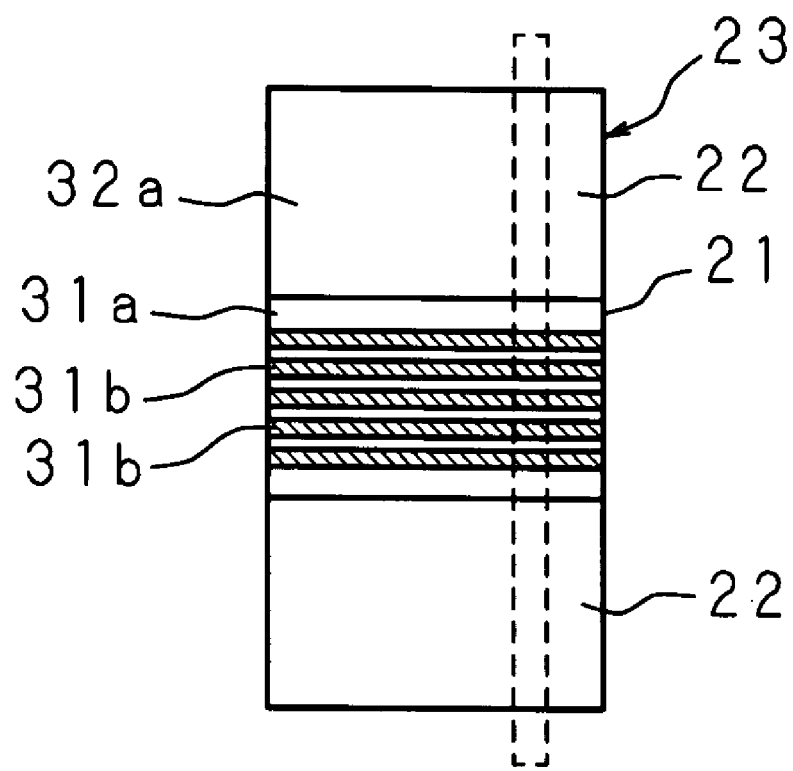
FIGS. 4A and 4B are diagrams showing the process in a fabrication method for a heat receiving sheet according to a first embodiment.
Figure 4B:
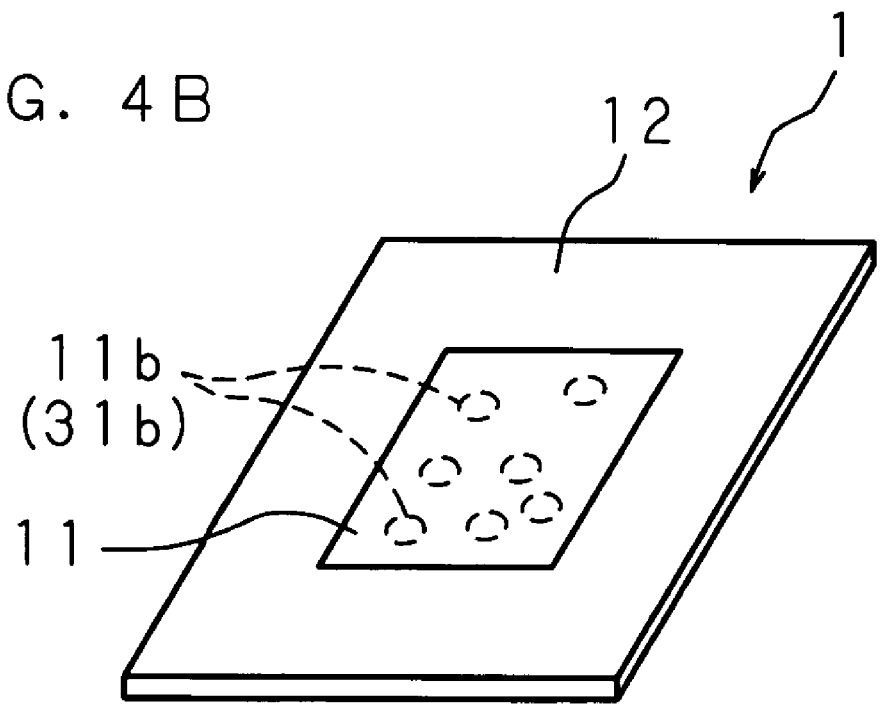

FIGS. 4A and 4B are diagrams showing the process in a fabrication method for a heat receiving sheet according to a first embodiment. A heat transfer block in which metal wires 31b are buried in a substrate 31a composed of silicone rubber is combined with a heat insulation block in which fillers for heat insulation (not shown) are distributed in a substrate 32a composed of silicone rubber, so that a combined body 23 is fabricated that is constructed from a combination of one or a plurality of heat transfer bodies 21 and one or a plurality of heat insulation bodies 22 (FIG. 4A). Alternatively, a plurality of heat transfer sheets and a plurality of heat insulation sheets may be laminated, so that the combined body 23 may be fabricated that is constructed from the heat transfer bodies 21 and the heat insulation bodies 22.

Then, when the combined body 23 is sliced at a position indicated by a broken line in FIG. 4A, a heat receiving sheet 1 provided integrally with a heat transfer part 11 and a heat insulation part 12 is obtained (FIG. 4B). According to this method, a heat receiving sheet provided with a heat transfer part and a heat insulation part is fabricated easily.

Second Embodiment

Figure 5A:
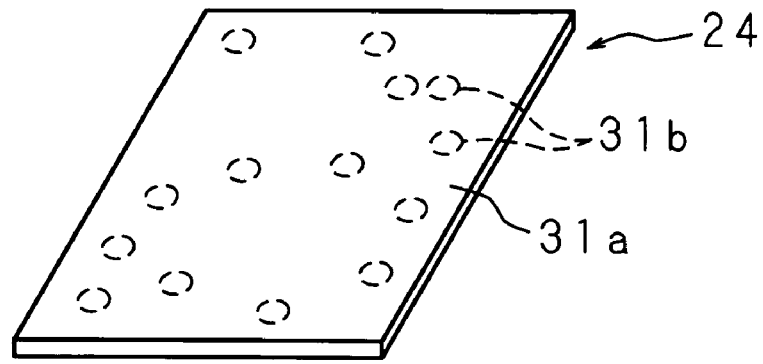
FIGS. 5A-5D are diagrams showing the process in a fabrication method for a heat receiving sheet according to a second embodiment.
Figure 5B:
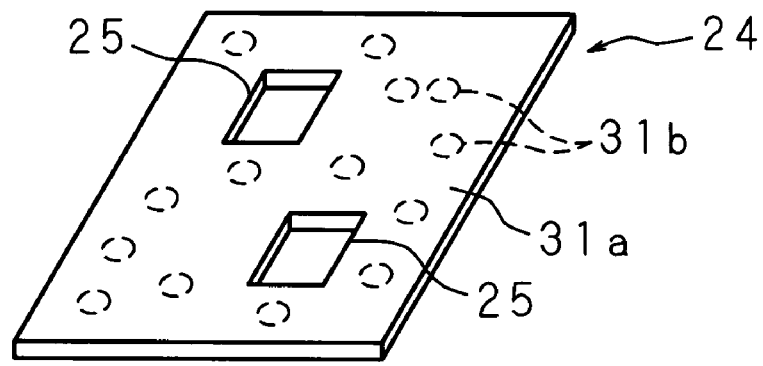
Figure 5C:
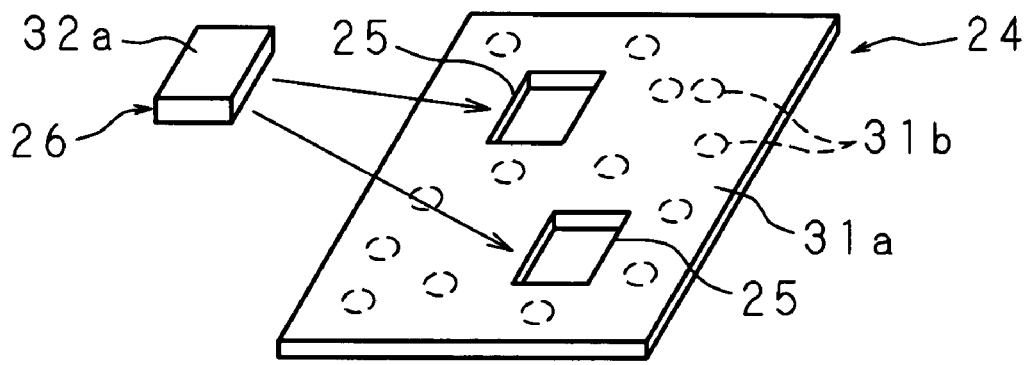
Figure 5D:
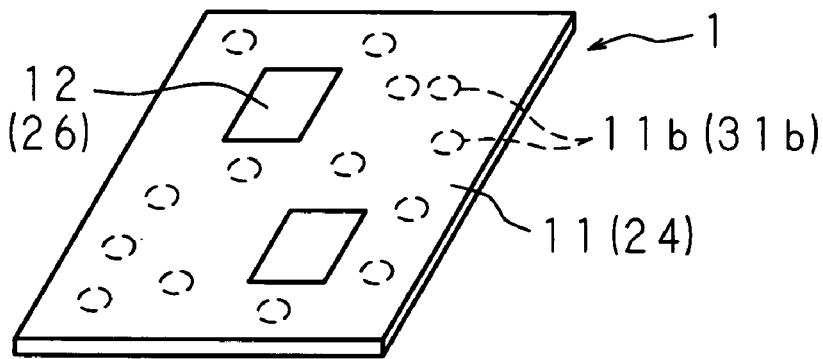

FIGS. 5A-5D are diagrams showing the process in a fabrication method for a heat receiving sheet according to a second embodiment. A heat transfer sheet 24 is fabricated in which metal wires 31b are buried in a substrate 31a composed of silicone rubber (FIG. 5A). Then, one or a plurality of holes 25 are formed by means of punching at predetermined locations of the heat transfer sheet 24 (FIG. 5B). Then, a heat insulation piece 26 in which fillers for heat insulation (not shown) are distributed in a substrate 32a composed of silicone rubber is inserted into each hole 25, so that a heat receiving sheet 1 provided integrally with the heat transfer part 11 and the heat insulation part 12 is obtained (FIGS. 5C and 5D). According to this method, a heat receiving sheet provided with a heat transfer part and a heat insulation part is fabricated easily.

In the example described here, a heat insulation piece is inserted into a hole in a heat transfer sheet. However, conversely, a heat transfer piece may be inserted into a hole in a heat insulation sheet, so that a heat receiving sheet may be fabricated.

Third Embodiment

Figure 6A:
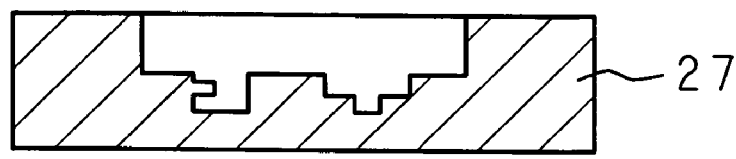
FIGS. 6A-6G are diagrams showing the process in a fabrication method for a heat receiving sheet according to a third embodiment.
Figure 6B:
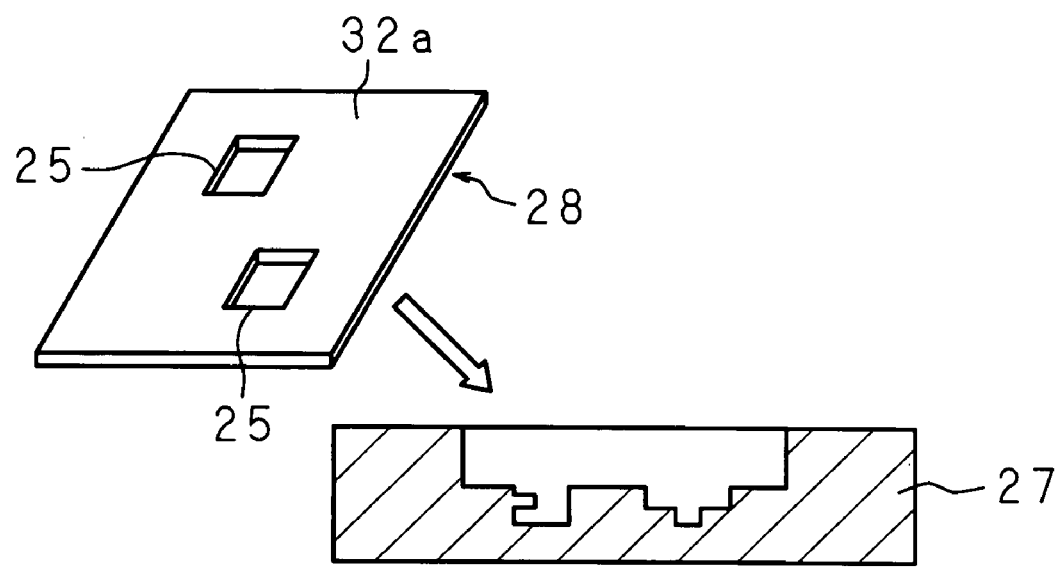
Figure 6C:
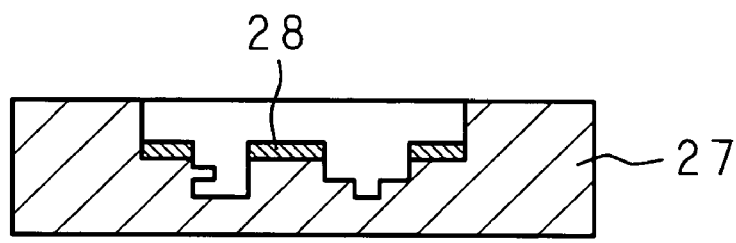

FIGS. 6A-6G are diagrams showing the process in a fabrication method for a heat receiving sheet according to a third embodiment. A mold cavity 27 is fabricated that has a shape in accordance with the shape of the heat receiving sheet to be fabricated (FIG. 6A). Then, a heat insulation sheet 28 in which fillers for heat insulation (not shown) are distributed in a substrate 32a composed of silicone rubber and in which one or a plurality of holes 25 are formed is placed in the mold cavity 27 (FIGS. 6B and 6C).

Figure 6D:
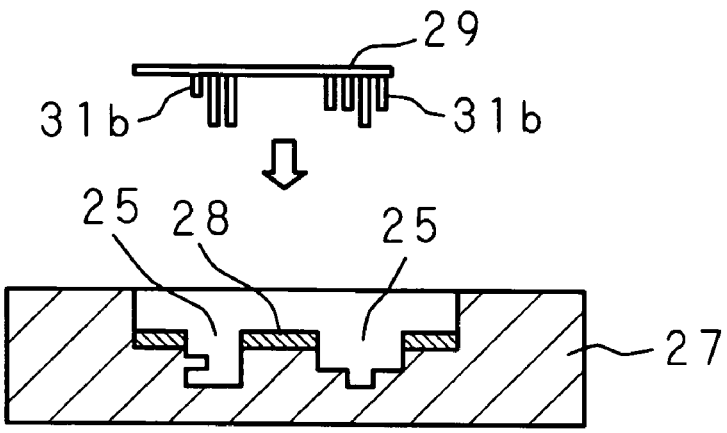
Figure 6E:
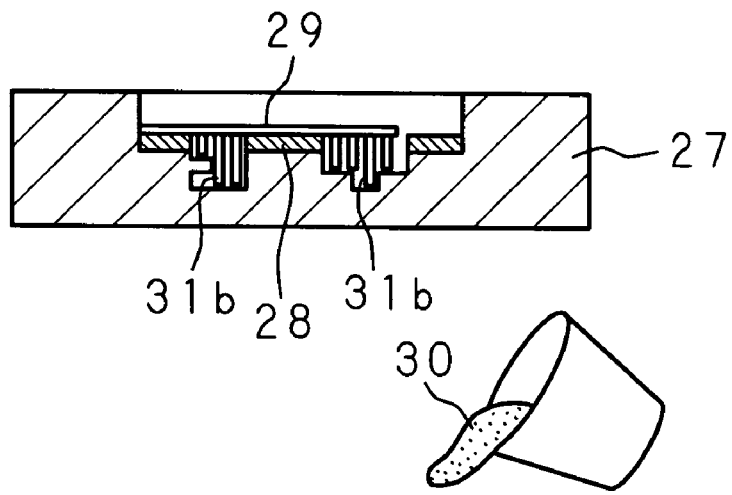
Figure 6F:
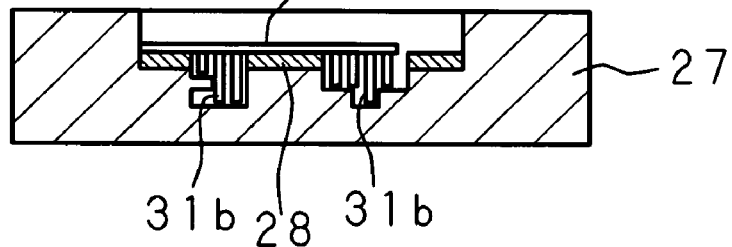
Figure 6G:
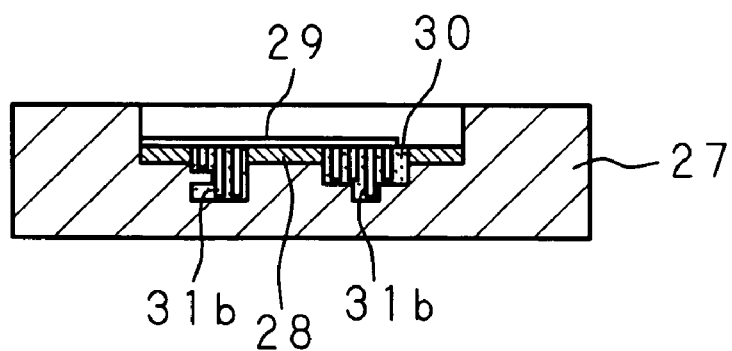

Then, a member 29 provided a plurality of metal wires 31b is placed in the mold cavity 27 in such a manner that the metal wires 31b should go into the holes 25 in the heat insulation sheet 28 placed in the mold cavity 27 (FIGS. 6D and 6E). Then, liquid silicone 30 is introduced into the mold cavity 27, and then is solidified (FIGS. 6F and 6G). After that, the product is removed from the mold cavity 27, so that a heat receiving sheet provided integrally with a heat transfer part and a heat insulation part is obtained.

According to this method, a heat receiving sheet provided with a heat transfer part and a heat insulation part is fabricated easily. Further, the use of a mold cavity realizes good reproducibility in the shape of the heat receiving sheet.

In the example described here, a heat insulation sheet is first placed in the mold cavity, and then a heat transfer part is formed. However, conversely, a heat transfer sheet may first be placed in the mold cavity previously, and then a heat insulation part may be formed by introducing and solidifying of the liquid silicone.

Figure 7:
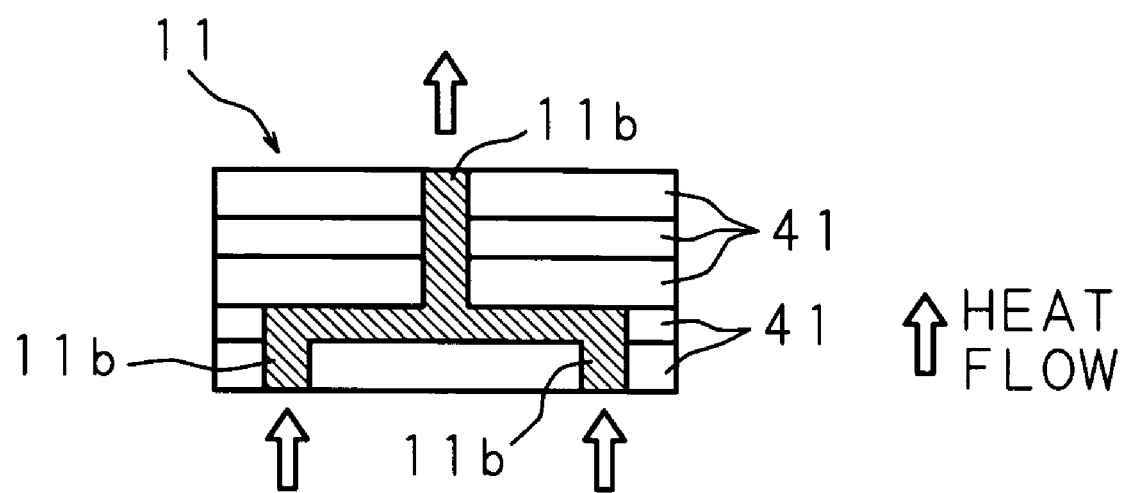
FIG. 7 is a sectional view showing an example of a heat transfer part.

The heat transfer part 11 and/or the heat insulation part 12 of the heat receiving sheet 1 of the invention may be constructed in the form of a single sheet, or alternatively in the form of a lamination of a plurality of sheets. FIG. 7 is a sectional view showing an example of a heat transfer part 11 constructed in the form of a lamination of a plurality of heat transfer sheets. In the example of FIG. 7, the arrangement pattern of the metal wires 11b in each heat transfer sheet 41 is adjusted, so that the direction of the heat flow (arrow marks in FIG. 7) is controlled.

Next, the result of an experiment is described below which has been conducted in order to check the effect of the heat receiving sheet of the invention. A simulated product (outer dimensions: 125-mm length×56-mm width×15-mm thickness) was fabricated that was provided with an electronic component having a high heat generation rate (heat-generating component) and an electronic component having a low heat generation rate and having thermal weakness (low-temperature component). Using this simulated product, a heat releasing process was performed under four kinds of conditions including the present invention case, so that the temperatures of the heat-generating component and the low-temperature component were measured, while the presence or absence of position slippage was checked for the heat receiving sheet.

The environmental conditions during the experiment were a room temperature of 23° C. and a relative humidity of 45%. In the temperature measurement, the simulated product was left intact for approximately 20 minutes in order that the temperature should reach equilibrium. The presence or absence of position slippage of the heat receiving sheet was checked in a state that the simulated product was inclined at 90 degrees. The result of the experiment for the four kinds of conditions (the present invention case, a control case, a prior art case, and a comparison case) is shown in FIG. 8.

In the present invention case, a heat receiving sheet (dimensions: 90-mm length×40-mm width×3-mm thickness) was adopted that was fabricated by combining the methods of the first and the second embodiments described above. Specifically, the adopted heat receiving sheet of the invention was fabricated as follows. A heat insulation body in which 30% (volume) of hollow balloons composed of resin (supplied from Japan Fillite Co., Ltd.) were mixed as fillers into a substrate composed of silicone rubber (supplied from Shin-Etsu Chemical Co., Ltd.) was sliced into a heat insulation sheet by using a slicing machine. Then, a hole is formed in a predetermined region of the fabricated heat insulation sheet. Then, a heat transfer piece in which 30% (volume) of copper wires (1-mm diameter) were mixed as metal wires into a substrate composed of silicone rubber (supplied from Shin-Etsu Chemical Co., Ltd.) was inserted into the hole.

In the control case, no heat receiving sheet was used at all. In the prior art case, a heat receiving sheet composed of a heat transfer sheet having a uniform composition across its entirety (a sheet of silicone with additive of alumina) was adhered over the entire area. In the comparison case, a heat receiving sheet equivalent to that of the prior art case was mounted only on the heat-generating component, while no heat receiving sheet was mounted on the low-temperature component.

In the control case, since no heat receiving sheet was used, the heat-generating component reached a temperature as extremely high as 92° C. That is, the cooling process was not achieved. In the prior art case, cooling of the heat-generating component was achieved. Nevertheless, the low-temperature component having thermal weakness reached a temperature as high as 40° C. Thus, adverse thermal influence to the low-temperature component is concerned. In the comparison case, a temperature rise was suppressed in the low-temperature component. Nevertheless, when the simulated product was inclined at 90 degrees, position slippage had occurred in the heat receiving sheet.

In contrast to these control case, prior art case, and comparison case, in the present invention case, an appropriate cooling process has been achieved in the heat-generating component. Further, a temperature rise was suppressed in the low-temperature component. Furthermore, no position slippage occurred in the heat receiving sheet.

As seen from the experimental result described here, when a heat receiving sheet of the invention is applied to an electronic apparatus comprising a plurality of electronic components having diverse heat characteristics, an efficient cooling process is achieved without causing a characteristic degradation in the electronic components. Further, when the thicknesses of the heat transfer part and the heat insulation part of the heat receiving sheet are adjusted in accordance with the heights of the electronic components in a contacted state, an efficient cooling process is achieved even for an electronic apparatus comprising a plurality of electronic components having diverse heights.

As described above, a heat receiving sheet according to the invention comprises a heat transfer part and a heat insulation part. Thus, heat from a heat generating body at a high temperature is transported at a high rate via the heat transfer part. On the other hand, a heat generating body having thermal weakness contacts with the heat insulation part, and hence does not receive heat from the heat receiving sheet. This suppresses adverse influence from the heat.

In an electronic apparatus according to the invention, a heat receiving sheet is arranged such that among a plurality of electronic components, an electronic component having a high heat generation rate should contact with the heat transfer part of the heat receiving sheet, and that an electronic component having a low heat generation rate should contact with the heat insulation part of the heat receiving sheet. Thus, heat from the electronic component at a high temperature is transported at a high rate via the heat transfer part. On the other hand, the electronic component having thermal weakness contacts with the heat insulation part, and hence does not receive heat from the heat receiving sheet. This suppresses adverse influence such as property degradation caused by the heat.

In a fabrication method for a heat receiving sheet according to the invention, one or a plurality of heat transfer bodies are combined with one or a plurality of heat insulation bodies, so that a combined body is fabricated. Then, the fabricated combined body is, for example, sliced. Thus, a heat receiving sheet comprising a heat transfer part and a heat insulation part is fabricated easily.

In a fabrication method for a heat receiving sheet according to the invention, a hole is fabricated in a sheet-shaped heat transfer body or a sheet-shaped heat insulation body. Then, a sheet-shaped heat insulation body or a sheet-shaped heat transfer body is inserted into the fabricated hole. Thus, a heat receiving sheet comprising a heat transfer part and a heat insulation part is fabricated easily.

In a fabrication method for a heat receiving sheet according to the invention, a mold cavity for a heat receiving sheet is fabricated. Then, a sheet-shaped heat transfer body or a sheet-shaped heat insulation body provided with one or a plurality of holes is placed in the fabricated mold cavity. Then, a sheet-shaped heat insulation body or a sheet-shaped heat transfer body is formed in the hole. Thus, a heat receiving sheet comprising a heat transfer part and a heat insulation part is fabricated easily with good reproducibility.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A heat receiving sheet for receiving heat generated in a plurality of heat generating bodies, comprising:
   a heat transfer part; and
   a heat insulation part;
   wherein said heat insulation part has a configuration that hollow bodies are distributed in a substrate composed of silicone rubber.

2. A heat receiving sheet for receiving heat generated in a plurality of heat generating bodies, comprising:
   a heat transfer part; and
   a heat insulation part;
   wherein said heat transfer part has a configuration that metal wires are buried in a substrate composed of silicone rubber.

3. The heat receiving sheet according to claim 2, wherein said heat insulation part has a configuration that hollow bodies are distributed in a substrate composed of silicone rubber.

4. An electronic apparatus provided with a heat receiving sheet for receiving heat generated in a plurality of electronic components, wherein
   said heat receiving sheet comprises a heat transfer part and a heat insulation part, while said heat receiving sheet is arranged such that among a plurality of said electronic components, a first electronic component having a high heat generation rate should contact with said heat transfer part, and that a second electronic component having a lower heat generation rate than said first electronic component should contact with said heat insulation part, and wherein
   said heat transfer part has a configuration that metal wires are buried in a substrate composed of silicone rubber, while said metal wires are oriented in a direction of heat flow.

5. An electronic apparatus provided with a heat receiving sheet for receiving heat generated in a plurality of electronic components, wherein
   said heat receiving sheet comprises a heat transfer part and a heat insulation part, while said heat receiving sheet is arranged such that among a plurality of said electronic components, a first electronic component having a high heat generation rate should contact with said heat transfer part, and that a second electronic component having a lower heat generation rate than said first electronic component should contact with said heat insulation part, and wherein
   thicknesses of said heat transfer part and said heat insulation part are set up depending on heights of said first electronic component having a high heat generation rate and said second electronic component having a low heat generation rate which are respectively in contact with said parts.

6. The electronic apparatus according to claim 5, wherein said heat transfer part has a configuration that metal wires are buried in a substrate composed of silicone rubber, while said metal wires are oriented in a direction of heat flow.

7. A method of fabricating a heat receiving sheet provided with a heat transfer part and a heat insulation part, comprising:
   fabricating a hole in a sheet-shaped heat transfer body or a sheet-shaped heat insulation body; and
   inserting a sheet-shaped heat insulation body or a sheet-shaped heat transfer body into the fabricated hole.

8. A method of fabricating a heat receiving sheet provided with a heat transfer part and a heat insulation part, comprising:
   fabricating a mold cavity for said heat receiving sheet;
   placing in the fabricated mold cavity a sheet-shaped heat transfer body or a sheet-shaped heat insulation body provided with one or a plurality of holes; and
   forming in said hole a sheet-shaped heat insulation body or a sheet-shaped heat transfer body.

* * * * *